United States Patent
Sather et al.

(10) Patent No.: US 6,178,111 B1
(45) Date of Patent: Jan. 23, 2001

(54) METHOD AND APPARATUS FOR WRITING DATA STATES TO NON-VOLATILE STORAGE DEVICES

(75) Inventors: Jeffrey Scott Sather, Medina; Theodore Zhu, Maple Grove; Yong Lu, Plymouth, all of MN (US)

(73) Assignee: Honeywell Inc., Morristown, NJ (US)

( * ) Notice: Under 35 U.S.C. 154(b), the term of this patent shall be extended for 0 days.

(21) Appl. No.: 09/455,850

(22) Filed: Dec. 7, 1999

(51) Int. Cl.[7] ............................................. G11C 11/00
(52) U.S. Cl. ........................................ 365/158; 365/225.5
(58) Field of Search ............................. 365/158, 171, 365/172, 225.5

(56) References Cited

U.S. PATENT DOCUMENTS

| | | | |
|---|---|---|---|
| 3,573,485 | 4/1971 | Ballard | 307/88 |
| 4,132,904 | 1/1979 | Harari | 307/238 |
| 4,731,757 | 3/1988 | Daughton et al. | 365/173 |
| 4,751,677 | 6/1988 | Daughton et al. | 365/158 |
| 4,829,476 | 5/1989 | Dupuis et al. | 365/158 |
| 4,887,236 | 12/1989 | Schloemann | 365/173 |
| 5,289,410 * | 2/1994 | Katti | 365/170 |
| 5,361,226 | 11/1994 | Taguchi et al. | 365/171 |
| 5,434,826 | 7/1995 | Ravipati et al. | 367/140 |
| 5,515,314 | 5/1996 | Kouhei et al. | 365/158 |
| 5,587,943 | 12/1996 | Torok et al. | 365/158 |
| 5,595,830 | 1/1997 | Daughton | 428/611 |
| 5,640,343 | 6/1997 | Gallagher et al. | 365/171 |
| 5,650,887 | 7/1997 | Dovek et al. | 360/75 |
| 5,650,958 | 7/1997 | Gallagher et al. | 365/173 |
| 5,654,566 | 8/1997 | Johnson | 257/295 |
| 5,695,864 | 12/1997 | Slonczewski | 428/212 |
| 5,701,222 | 12/1997 | Gill et al. | 360/113 |
| 5,701,223 | 12/1997 | Fontana, Jr. et al. | 360/113 |
| 5,748,519 | 5/1998 | Tehrani et al. | 365/98 |
| 5,776,537 | 7/1998 | Ryan et al. | 427/8 |
| 5,801,529 | 9/1998 | Umemoto et al. | 324/207.12 |
| 5,825,685 * | 10/1998 | Yamane et al. | 365/158 |
| 5,861,328 | 1/1999 | Tehrani et al. | 438/210 |
| 6,097,625 * | 8/2000 | Scheuerlein | 365/171 |

FOREIGN PATENT DOCUMENTS

| | | | |
|---|---|---|---|
| 0 776 011 A2 | 5/1997 | (EP) | G11C/11/15 |
| WO 98/20496 | 5/1998 | (WO) | G11C/11/00 |

* cited by examiner

Primary Examiner—Son Mai
(74) Attorney, Agent, or Firm—Kris T. Fredrick (57) ABSTRACT

Disclosed are apparatus and methods for efficiently writing states to one or more magneto-resistive elements. In one embodiment, current switches are provided for directing a write current through a number of write lines to control the write state of the magneto-resistive elements. In another embodiment, a sense current is selectively controlled to control which magneto-resistive elements are written to a particular state. In both embodiments, a latching element may be used to sense the state of the magneto-resistive elements, and may assume a corresponding logic state.

42 Claims, 7 Drawing Sheets

METHOD AND APPARATUS FOR WRITING DATA STATES TO NON-VOLATILE STORAGE DEVICES

CROSS-REFERENCE TO CO-PENDING APPLICATIONS

This application is related to co-pending U.S. patent application Ser. No. 09/059,871, filed Apr. 14, 1998, entitled "Non-Volatile Storage Latch", which is incorporated herein by reference.

BACKGROUND OF THE INVENTION

This invention relates to the field of electronic memory devices, and more particularly, to non-volatile storage devices.

Most digital electronic devices use both logic gates and memory elements to implement a desired function. The memory elements are used to store initial, intermediate and/or final data. The logic gates are used to provide and/or receive the data to/from the memory elements, and perform the necessary data manipulation. In a typical digital system, the basic memory elements are bi-stable logic circuits known as latching elements. There are numerous types of latching elements including, for example, D-latches, RS-latches, JK-latches, etc. These latching elements are often combined to form various forms of flip-flops, shift registers or other storage devices.

Latching elements typically use one or more feedback paths that have an even number of inversions. By providing an even number of inversions, the feedback path reinforces the stored data state of the latching element. To write a desired state to the latching element, the feedback path is typically overdriven or a switch is provided to temporarily interrupt the feedback path while a new data state is provided to the latching element. The most basic latching element includes a pair of cross-coupled inverters. There are, however, numerous other known implementations.

Conventional latching elements suffer from a number of limitations, some of which are described below. First, the initial state of a latching element is typically unknown. This limitation can cause a number of problems in a circuit or system. For example, the enable signal of selected output buffers is typically either directly or indirectly controlled by the state of a latching element. Because the state of the latching elements are unknown upon power-up, one or more of the output buffers may be simultaneously enabled. This is particularly problematic when the output buffers are coupled to a bi-directional bus, for example, where one buffer may attempt to overdrive another thereby drawing significant power and possibly causing damage to selected circuit elements.

To alleviate this and other problems, many systems require an initialization procedure to be executed shortly after power-up. One purpose of the initialization procedure is to initialize the state of selected latching elements. The initialization procedure may, for example, reset selected latching elements to disable the output buffers of a circuit or system. Generally, the initialization procedure initializes selected latching elements to prepare the device for subsequent processing. Requiring an initialization procedure increases the time required to boot the system.

Another related limitation of many conventional latching elements is that the data stored therein is lost when power is lost or otherwise interrupted. For example, when a personal computer or other data processing system loses power, the data stored in the latching elements are lost. When power is restored, the data processing system assumes an initial state that is unrelated to the state of the data processing system before the power loss. Often, much of the processing that was completed coincident with or prior to the power loss is lost, or must be re-constructed and/or re-executed which can be a time consuming and tedious task.

In high reliability applications, a primary power source and an auxiliary power source may be provided to reduce the likelihood that the latching elements will experience a power loss. In such systems, an auxiliary power source is used when the primary power fails. A limitation of this approach is that significant overhead is required including an auxiliary power source, a power degradation detection mechanism and a power switching mechanism. In addition, the auxiliary power source is often a battery or the like that has a limited lifetime. Therefore, if the primary power source fails for an extended period of time, the auxiliary power source may also fail causing the latching elements to lose the data stored therein.

A latching element that overcomes many of these limitations is disclosed in co-pending U.S. patent application Ser. No. 09/059,871, entitled "Non-volatile Storage Latch", which is incorporated herein by reference. In one aspect, the referenced latching element senses the resistive state of one or more magnetic elements. By programming the magnetic elements to appropriate resistance values, the latching elements assumes a desired or known initial state upon power up.

SUMMARY OF THE INVENTION

The present invention is directed to means for efficiently writing desired states to one or more non-volatile latching elements that include one or more magneto-resistive elements. In one embodiment, the latching elements sense the state of a corresponding magnetic element pair. One of the magnetic elements of the magnetic pair is preferably written to a lower resistance state while the other magnetic element is preferably written to a higher resistance state. During a write, the latching element, which may be a cross-coupled inverter or the like, may sense the resistance differential of the magnetic element pair and assumes a corresponding logic state. The desired resistance state of any given magnetic element depends on the logic value that is to be stored in the latching element.

In accordance with one illustrative embodiment of the present invention, each magneto-resistive pair has a first local write line extending above a first magneto-resistive element and below the other, and a second local write line extending below the first magneto-resistive element and above the other. In this configuration, a write current passing through the first local write line may write the first magneto-resistive element to a low resistance state and the second magneto-resistive element to a high resistance state. Likewise, a write current passing through the second local write line may write the first magneto-resistive element to a high resistance state and the second magneto-resistive element to a lower resistance state.

Preferably, a number of magneto-resistive pairs are arranged in a string configuration with a first magneto-resistive pair at one end of the string and a last magneto-resistive pair at the other end of the string. In one embodiment, a current switch is provided between each magneto-resistive pair. The current switch for the first magneto-resistive pair preferably accepts a write current from a current source, voltage source, or the like, and switches the write current to either the first or second local write lines of the first magneto-resistive pair, depending on the state of a first write data signal. Each subsequent current switch preferably accepts an input write current from the first and second local write lines of an adjacent magneto-resistive pair, and switches the input write current to either the first or second local write lines of the corresponding magneto-resistive pair, depending on the state of the corresponding write data signal. In one illustrative embodiment, the first and second local write lines of the last magneto-resistive pair are connected to ground.

Each current switch may include an input terminal, a first output terminal, a second output terminal and a control terminal. The input terminal of the first current switch may be coupled to a current source or the like. The input terminal of the remaining current switches may be coupled to both the first and second local write lines of an adjacent magneto-resistive pair. The first output terminal of each current switch may be coupled to the first local write line of the corresponding magneto-resistive pair. The second output terminal of each current switch may be coupled to the second local write line of the corresponding magneto-resistive pair. The control terminal for each current switch is preferably coupled to a corresponding write data signal.

In this configuration, the first current switch accepts a write current from a current source or the like, and switch the write current to either the first local write line or the second local write line of the corresponding magneto-resistive pair, depending on the state of the corresponding write data signal. The remaining current switches accept a write current from the first and second local write lines of an adjacent magneto-resistive pair, and switch the write current to either the first local write line or the second local write line of the corresponding magneto-resistive pair, depending on the state of the corresponding write data signal.

In another illustrative embodiment of the present invention, the first local write line extends adjacent a first one of the magneto-resistive elements of a corresponding magneto-resistive pair, and a second local write line extends adjacent the second one of the magneto-resistive elements. However, in this embodiment, both the first and second local write lines preferably extend adjacent the same side of the magneto-resistive elements. Like above, a number of magneto-resistive pairs are preferably arranged in a string configuration with a first magneto-resistive pair at one end of the string and a last magneto-resistive pair at the other end of the string. Likewise, a current switch is preferably provided between each of the magneto-resistive pairs.

The current switch for the first magneto-resistive pair preferably accepts an input write current from a current source or the like, and switches the input write current to either the first or second local write line of the first magneto-resistive pair, depending on the state of the corresponding write data signal. The first current switch also preferably accepts a return current from either the first or second local write line (the write line that does not carry the input write current), and switches the return current to ground or the like. Each subsequent current switch preferably accepts the input write current from the local write line of the previous magneto-resistive pair that carries the input write current, and switches the input write current to either the first or second local write lines of the corresponding magneto-resistive pair, depending on the state of the corresponding write data signal. Thus, in this configuration, each magneto-resistive pair has one local write line that carries the input write current.

In the illustrative embodiment, the first and second local write lines of the last magneto-resistive pair are connected together after extending past the first one of the magneto-resistive elements and the second one of the magneto-resistive elements, respectively. This forms a return path for the input write current. Thus, in the illustrative embodiment, each current switch also preferably accepts a return write current from the local write line of the corresponding magneto-resistive pair that does not carry the input write current, and switches the return write current to the local write line of an adjacent magneto-resistive pair that also does not carry the input write current. The return write current preferably passes over the corresponding magneto-resistive elements in an opposite direction relative to the direction that the input write current. Accordingly, the input write current may write a first magneto-resistive state to each of the magneto-resistive elements it passes, and the return write current may write a second magneto-resistive state to the magneto-resistive elements it passes.

In an illustrative embodiment, each current switch may include a first switch for electrically connecting a first input terminal to a first output terminal and a second input terminal to a second output terminal, when a control terminal of the current switch is in a first data state. Each current switch may also have a second switch for electrically connecting the first input terminal to the second output terminal and the second input terminal to the first output terminal, when the control terminal of the current switch is in a second data state.

The control terminal of the first current switch is preferably controlled by the corresponding write data signal. The control terminal of each subsequent current switch is preferably generated and controlled by exclusive-noring the corresponding write data signal with the write data signal of the previous magneto-resistive pair. In the configuration, the exclusive-nor function provides the information that is needed to make the appropriate switching decision.

In another illustrative embodiment, a number of magneto-resistive pairs are provided in a string configuration, wherein each of the magneto-resistive elements receive a sense current in a predetermined direction. The magneto-resistive elements are configured such that both a sense current and a write current must pass adjacent to the magneto-resistive elements to write the magneto-resistive elements to a desired state.

In this illustrative embodiment, a single write line may be used. The single write line may extend adjacent to each of the magneto-resistive elements. For each magneto-resistive pair, the single write line preferably extends in a first direction relative to the direction of the sense current in a first magneto-resistive element of a magneto-resistive pair, and in a second direction relative to the direction of the sense current in a second magneto-resistive element of the magneto-resistive pair. Thus, a write current passing in a first direction through the single write line may write a first resistive state into the first magneto-resistive element and a second resistive state into the second magneto-resistive element provided a sense current is also provided through the magneto-resistive pair.

To write a string of magneto-resistive pairs, therefore, a sense current is first provided to only those magneto-resistive pairs that have a corresponding write data signal that is in a first data state. Overlapping therewith, a write current is provided in a first direction through the single write line. This writes those magneto-resistive pairs that have a write data signal that is in a first data state to resistive values that correspond to the first data state.

Thereafter, a sense current is provided to only those magneto-resistive pairs Overlapping therewith, a write current is provided in a second direction through the single write line. This writes those magneto-resistive pairs that have a write data signal that is in the second data state to resistive values that correspond to the second data state.

In a preferred embodiment, the sense current is provided by a corresponding latch element. The latch element may be adapted to selectively provide a sense current to the corresponding magneto-resistive pair when a corresponding latch write signal is asserted. The latch write signal may be generated by gating the corresponding write data signal with a first clock signal, preferably with an exclusive-nor gate. In this configuration, the latch write signals for those latch elements that have a corresponding write data signal that is in the first data state are activated when the first clock signal is asserted. Likewise, the latch write signals for those latch elements that have a corresponding write data signal that is in the second data state are activated when the first clock signal is not asserted. Preferably, the write current is provided through the single write line in the second opposite direction when the first clock signal is not asserted.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1A:
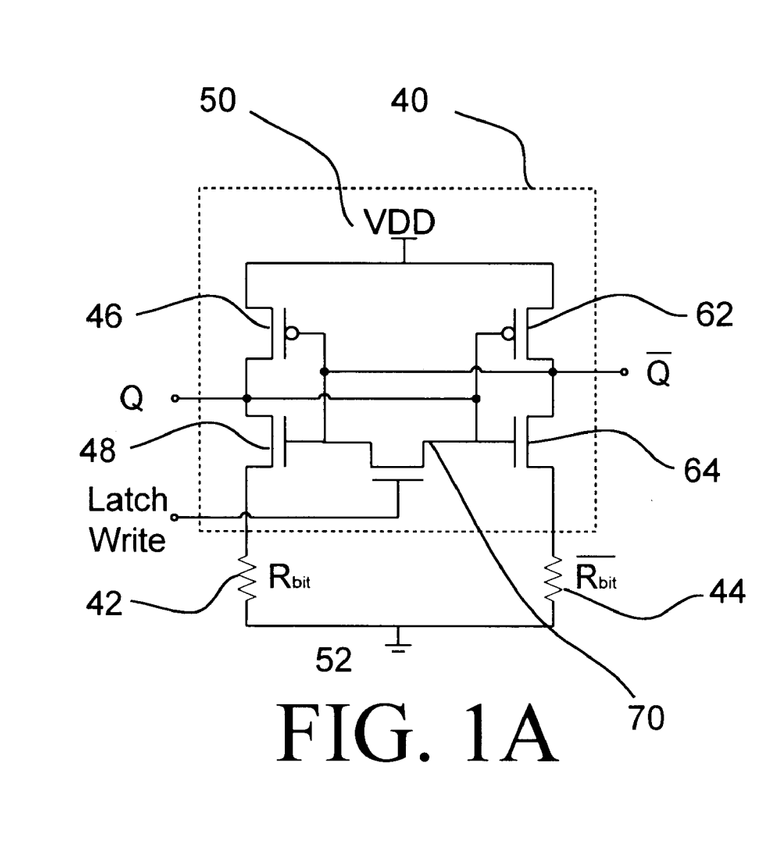
FIG. 1A is a schematic diagram of a latching element connected to a pair of magneto-resistive elements.
Figure 1B:
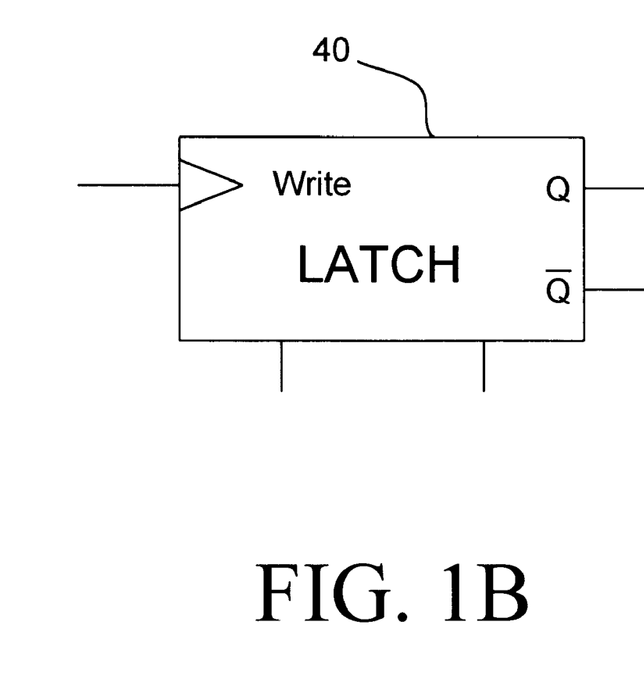
FIG. 1B is a symbol of the latching element of FIG. 1A.

FIG. 1 is a schematic diagram of a latching element 40 connected to a pair of magneto-resistive elements 42 and 44. FIG. 1B is a symbol of the latching element 40. The latching element 40 includes a first inverter having p-channel transistor 46 and n-channel transistor 48, and a second inverter having p-channel transistor 62 and n-channel transistor 64. The first inverter and the second inverter are coupled together in a well-known cross-coupled configuration.

The latching element further has a first power supply terminal 50 and a second power supply terminal 52. In the illustrative embodiment, the source terminals of p-channel transistors 46 and 62 are coupled to the first power supply terminal 50. A first magnetic element 42 is disposed between the source of the n-channel transistor 48 and the second power supply terminal 52. Likewise, a second magnetic element 44 is disposed between the source of the n-channel transistor 64 and the second power supply terminal 52.

A reset or write transistor 70 may be provided between the inputs of the first and second inverters. More specifically, the source terminal of the write transistor 70 may be coupled to the gate terminals of p-channel transistor 46 and n-channel transistor 48, and the drain terminal of write transistor 70 may be connected to the gate terminals of p-channel transistor 62 and n-channel transistor 64. In this configuration, the write transistor 70 selectively substantially equalizes the voltage of the inputs of the first and second inverters when transistor 70 is activated.

It is contemplated that latching element 40 may be fabricated using discrete logic or integrated logic, including any number of integrated circuit technologies including BIPOLAR, CMOS, BICMOS, etc. It is also contemplated that the magnetic elements 42 and 44 may include anisotropic magnetoresistive (AMR) type materials, giant magnetoresistive (GMR) type materials, colossal magnetoresistive (CMR) type materials, spin dependent tunneling type devices, spin valve type devices, or any other magnetic material or device. In a preferred embodiment, the magnetic elements are "pseudo" spin valve structures. A pseudo spin valve structure preferably includes an electrically conducting, non-magnetic material such as Cu that is sandwiched between two ferromagnetic layers such as NiCoFe.

The top active ferromagnetic layer is preferably the storage layer and the bottom active ferromagnetic layer is preferably a hard layer. To permit the magnetization vector of the top storage layer to rotate in response to a write current, the thickness of the top storage layer is reduced relative to the bottom hard layer. The difference in thickness of the two ferromagnetic layers produces a differential in coercivities of the two layers. In a preferred embodiment, the coercivity of the thinner storage layer is sufficiently small to permit the magnetization vector thereof to rotate in response to a write current. For latching elements, the coercivity of the thinner storage layer is also made sufficiently large to prevent the demagnetization fields of the bottom hard layer from rotating the magnetization vector of the storage layer anti-parallel to the magnetization vector of the hard layer.

Preferably, the first magnetic element 42 is programmed to a different resistance state than the second magnetic element 44. During power up, or when the write transistor 70 is enabled, the latching element 40 senses the resistance differential between the first magnetic element 42 and the second magnetic element 44, which causes the latching element 40 to assume a corresponding logic state.

Figure 2:
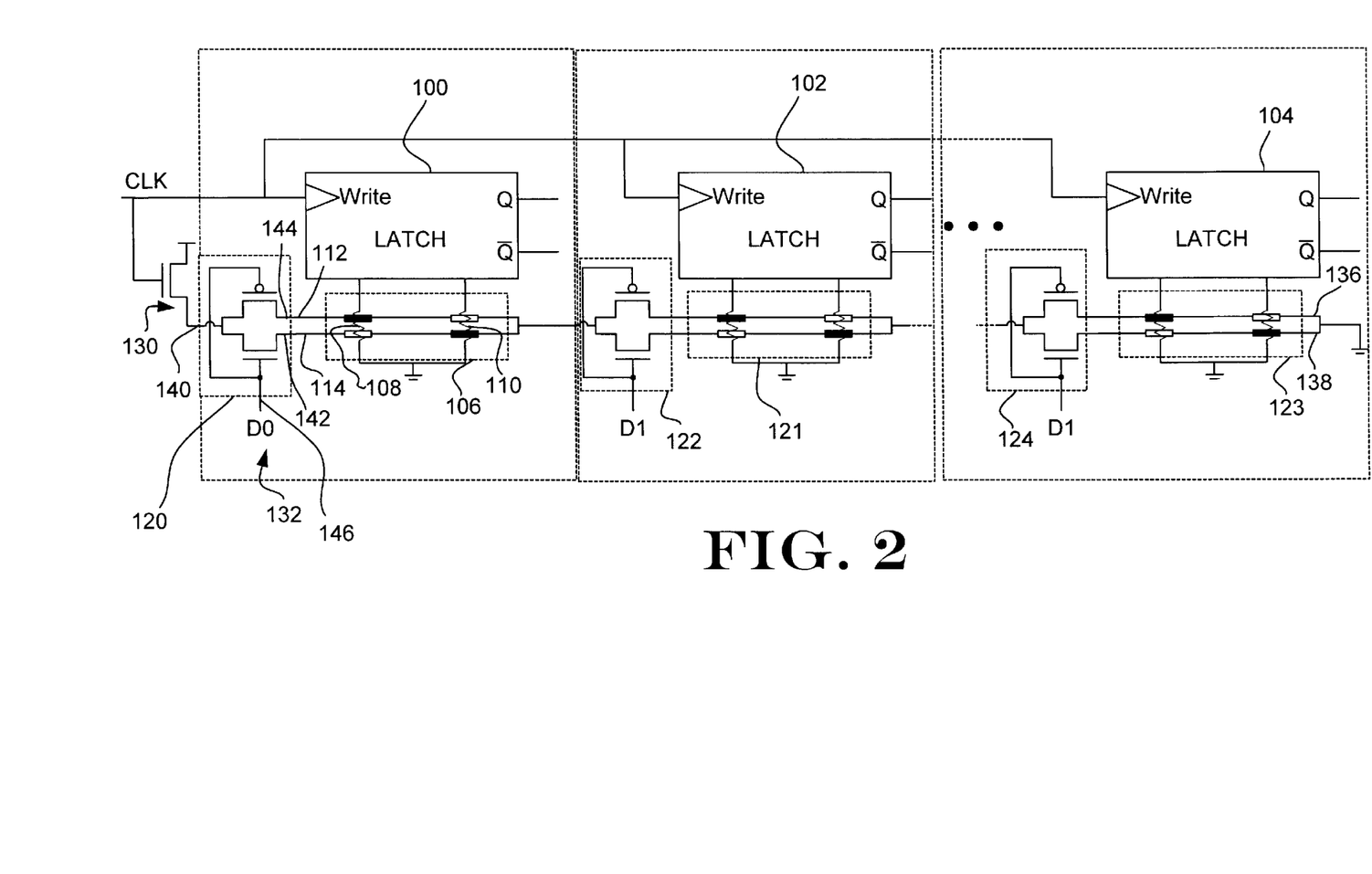
FIG. 2 is a schematic diagram of an illustrative N-bit register using N latching element of FIG. 1A, wherein each latching element has a first and second local write line and a current switching element.

FIG. 2 is a schematic diagram of an N-bit register using N of the latching elements of FIG. 1A. The N latching elements are shown at 100, 102 and 104. Each of the latching elements 100, 102 and 104 is coupled to a corresponding magneto-resistive pair, as described more fully above with respect to FIG. 1A. For example, latching element 100 is coupled to a magneto-resistive pair 106, latching element 102 is coupled to magneto-resistive pair 121 and latching element 104 is coupled to magneto-resistive pair 123.

In the illustrative embodiment, each magneto-resistive pair includes a first magnetic element and a second magnetic element. For example, magneto-resistive pair 106 includes a first magnetic element 108 and a second magnetic element 110. A first local write line 112 extends above the first magnetic element 108 and below the second magnetic element 110. A second local write line 114 extends below the first magnetic element 108 and above the second magnetic element 110. In FIG. 2, the blackened rectangles indicate that the write line extends above the corresponding magnetic element and the transparent rectangles indicate that the write line extends below the corresponding magnetic element.

Figure 3:
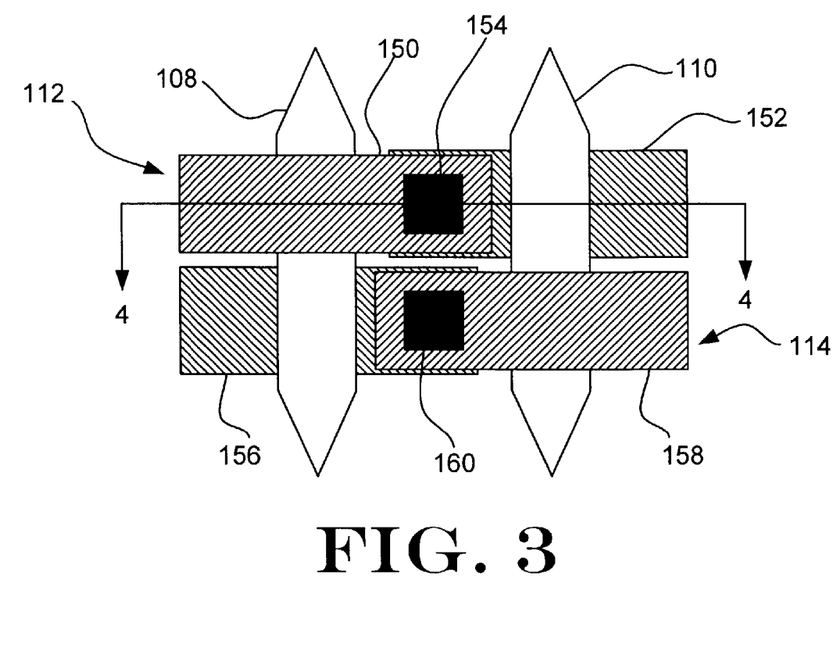
FIG. 3 is an illustrative layout of one of the magneto-resistive pairs and corresponding first and second local write lines of FIG. 2.
Figure 4:
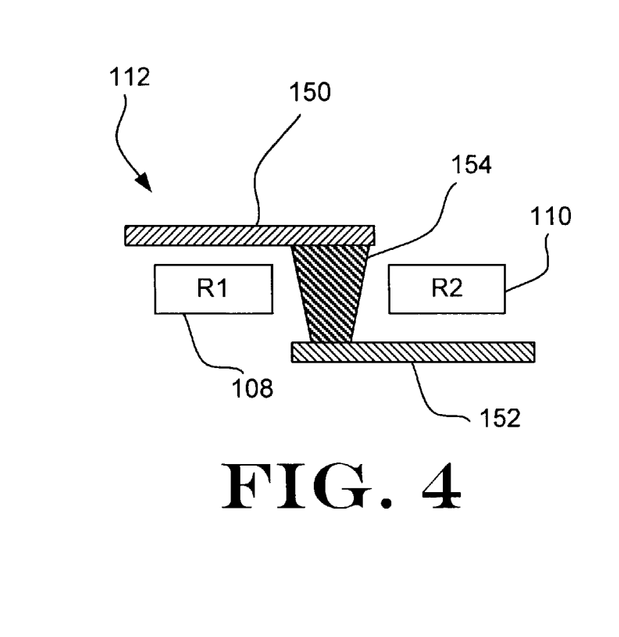
FIG. 4 shows a cross-sectional view of one of the local write lines of FIG. 2 taken along line 4—4.

FIG. 3 shows an illustrative layout of the magneto-resistive pair 108 and 110 and the corresponding first and second local write lines of FIG. 2. The first local write line 112 includes an upper metal layer 150 and a lower metal layer 152. The upper metal layer 150 extends over magneto-resistive element 108, and the lower metal layer 152 extends under magneto-resistive element 110. A via 154 connects the upper and lower metal layers 150 and 152. The via 154 is preferably provided between magneto-resistive element 108 and magneto-resistive element 110, as shown. This arrangement is further shown in FIG. 4.

The second local write line 114 also includes an upper metal layer 158 and a lower metal layer 156. However, the upper metal layer 158 extends over magneto-resistive element 110 while the lower metal layer 156 extends under magneto-resistive element 108. A via 160 is then provided between magneto-resistive element 108 and magneto-resistive element 110 to provide a connection between the upper and lower metal layers 156 and 158.

In this configuration, a write current passing through the first local write line 112 may write the first magnetic element 108 to a first resistance state and the second magnetic element 110 to a second resistance state. Likewise, a write current passing through the second local write line 114 may write the first magnetic element 108 to the second resistance state and the second magnetic element 110 to the first resistance state.

Referring back to FIG. 2, the magneto-resistive pairs are preferably arranged in a string configuration with a first magneto-resistive pair 106 at one end of the string and a last magneto-resistive pair 123 at the other end of the string. Each magneto-resistive pair also preferably has a corresponding current switch. For example, magneto-resistive pair 106 has current switch 120, magneto-resistive pair 121 has current switch 122 and magneto-resistive pair 123 has current switch 124. Each current switch accepts an input write current, and switches the input write current to either the first or second local write lines of the corresponding magneto-resistive pair, depending on the state of a corresponding write data signal.

The first current switch 120 preferably accepts an input write current from a current source 130, voltage source, or the like, and switches the input write current to either the first or second local write lines 112 or 114 of the first magneto-resistive pair, depending on the state of a first write data signal 132. Each subsequent current switch 122 and 124 then accepts an input write current from the first and second local write lines of the adjacent magneto-resistive pair, and switches the write current to either the first or second write lines of the corresponding magneto-resistive pair, depending on the state of the corresponding write data signal.

Preferably, the first and second local write lines 136 and 138 of the last magneto-resistive pair 123 extend past the corresponding magnetic elements before being connected to ground. This terminates the current path that extends from the current source 130 or the like.

Each current switch may have an input terminal 140, a first output terminal 142, a second output terminal 144 and a control terminal 146. In the embodiment shown, each current switch has an n-channel transistor and a p-channel transistor. The source of the n-channel transistor is coupled to the source of the p-channel transistor, and further coupled to the input terminal 140. The drain of the n-channel transistor is coupled to the first output terminal 142. The drain of the p-channel transistor is coupled to the second output terminal 144. Finally, the gate of the n-channel transistor and the gate of the p-channel transistor are coupled together and to the control input terminal 146.

Figure 5:
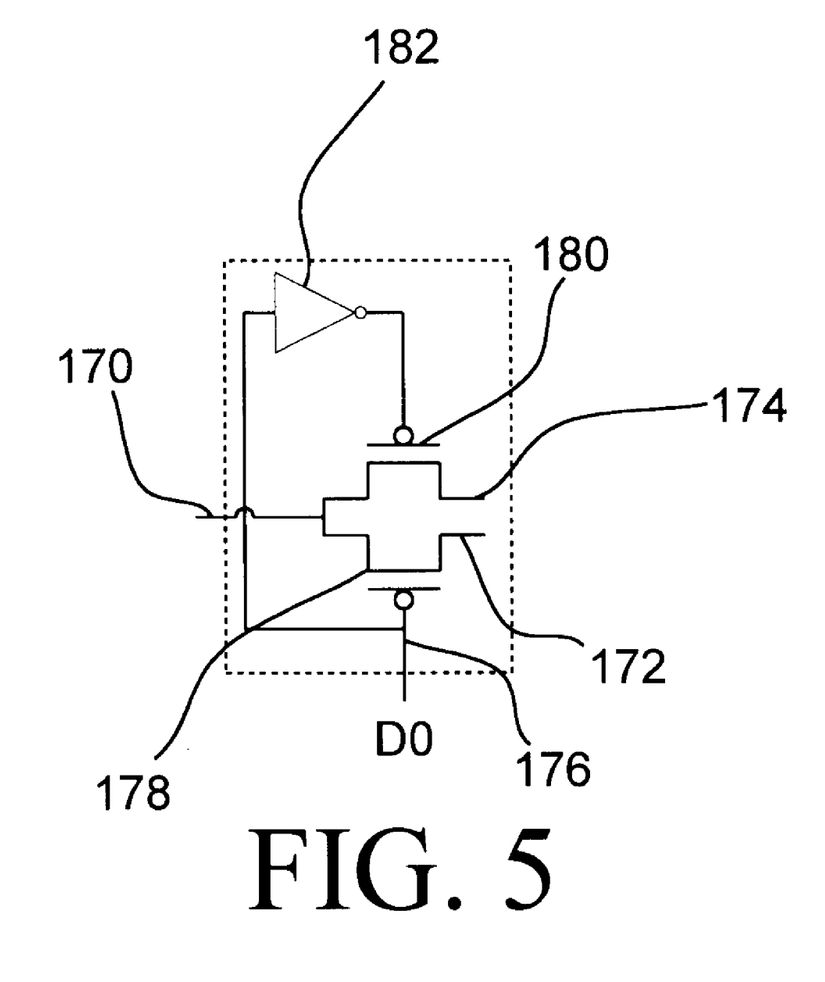
FIG. 5 is a schematic diagram of another illustrative current switch in accordance of the present invention.

An alternative current switch is shown in FIG. 5. In this embodiment, the current switch includes an input terminal 170, a first output terminal 172, a second output terminal 174 and a control terminal 176. The source of a first p-channel transistor 178 is coupled to the source of a second p-channel transistor 180, and further coupled to the input terminal 170. The drain of the first p-channel transistor 178 is coupled to the first output terminal 172. The drain of the second p-channel transistor 180 is coupled to the second output terminal 174. Finally, the gate of the first p-channel transistor 178 coupled to the control input terminal 176. An inverter 182 is then provided, wherein the input of the inverter 182 is coupled to the control input terminal 176 and the output of the inverter 182 is coupled to the gate of the second p-channel transistor 180. It is contemplated that the first p-channel transistor 178 and the second p-channel transistor 180 may be replaced with n-channel transistors, if desired. By including two transistors with the same polarity, equal drive can be delivered to the first and second write lines that are connected to the first and second output terminals 172 and 174.

Figure 6:
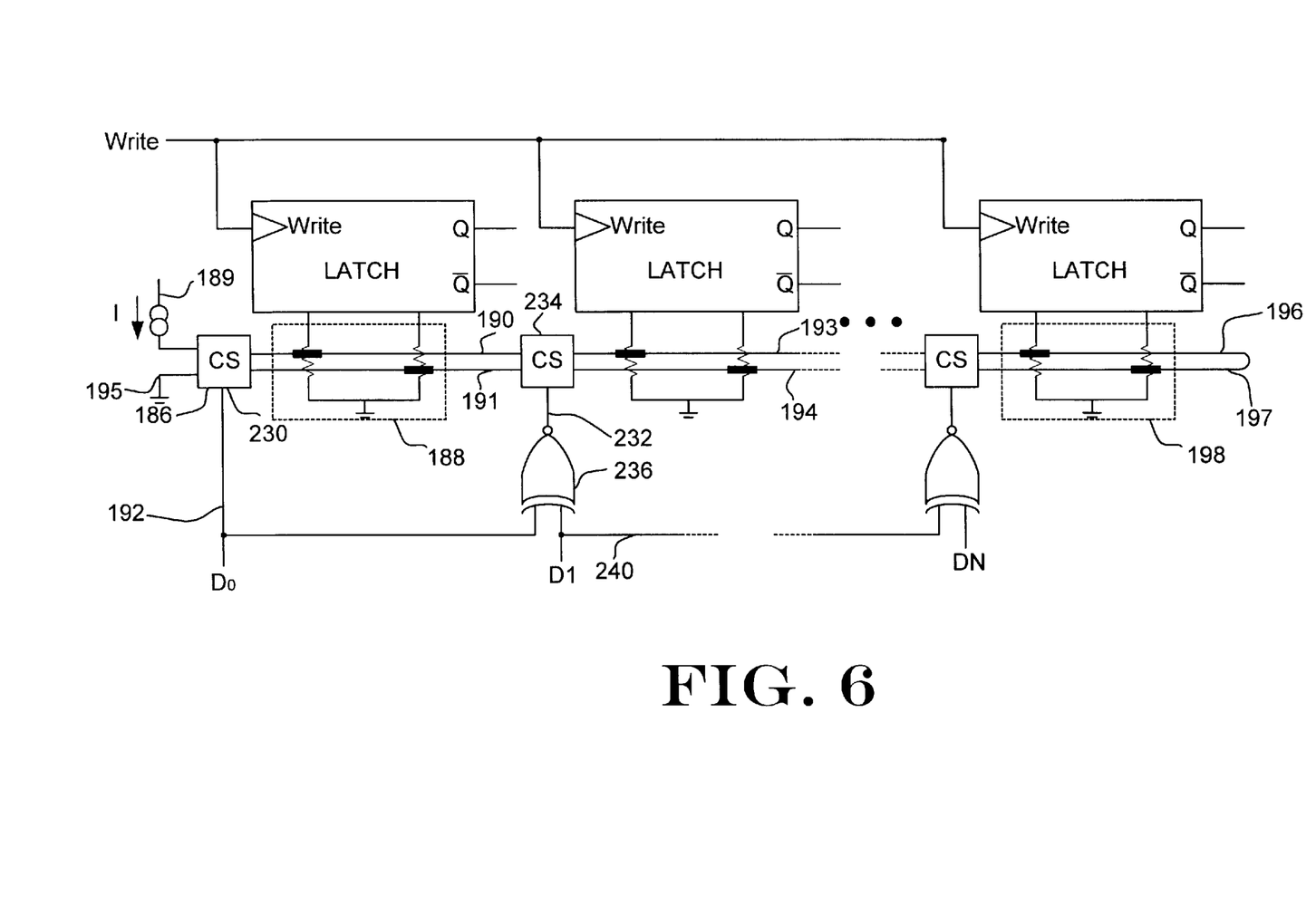
FIG. 6 is a schematic diagram of yet another illustrative N-bit register in accordance with the present invention.

FIG. 6 is a schematic diagram of another illustrative N-bit register in accordance with the present invention. In this illustrative embodiment, a first local write line extends adjacent a first one of the magneto-resistive elements of a corresponding magneto-resistive pair, and a second local write line extends adjacent the second one of the magneto-resistive elements. However, in this embodiment, both the first and second local write lines preferably extend adjacent the same side of the magneto-resistive elements, and thus can be formed using a single metal layer. Like above, the magneto-resistive pairs are preferably arranged in a string configuration with a first magneto-resistive pair at one end of the string and a last magneto-resistive pair at the other end of the string. Likewise, a current switch is provided for each magneto-resistive pair.

The current switch 186 for the first magneto-resistive pair 188 preferably accepts an input write current from a current source 189 or the like, and switches the input write current to either the first local write line 190 or second local write line 191 of the first magneto-resistive pair 188, depending on the state of the corresponding write data signal 192. The first current switch also preferably accepts a return current from either the first local write line 193 or second local write line 194 (e.g., the write line that does not carry the input write current), and switches the return current to ground 195 or the like. Each subsequent current switch then accepts the input write current from the local write line of the previous magneto-resistive pair that carries the input write current, and switches the input write current to either the first or second local write lines of the corresponding magneto-resistive pair, depending on the state of the corresponding write data signal. The other local write line carries the return current. Thus, in this configuration, each magneto-resistive pair has one local write line that carries the input write current, and another that carries the return current.

In the illustrative embodiment, the first local write line 196 and the second local write line 197 of the last magnetoresistive pair 198 are connected together after extending past the first one of the magneto-resistive elements and the second one of the magneto-resistive elements, respectively. This forms the return path for the input write current. Thus, as indicated above, each current switch accepts a return write current from the local write line of the corresponding magneto-resistive pair that does not carry the input write current, and switches the return write current to the local write line of an adjacent magneto-resistive pair that also does not carry the input write current. The return write current preferably passes over the magneto-resistive elements in an opposite direction relative to the direction that the input write current. Accordingly, the input write current may write a first magneto-resistive state to each of the magneto-resistive elements that it passes, and the return write current may write a second magneto-resistive state to the magneto-resistive elements it passes.

Figure 7:
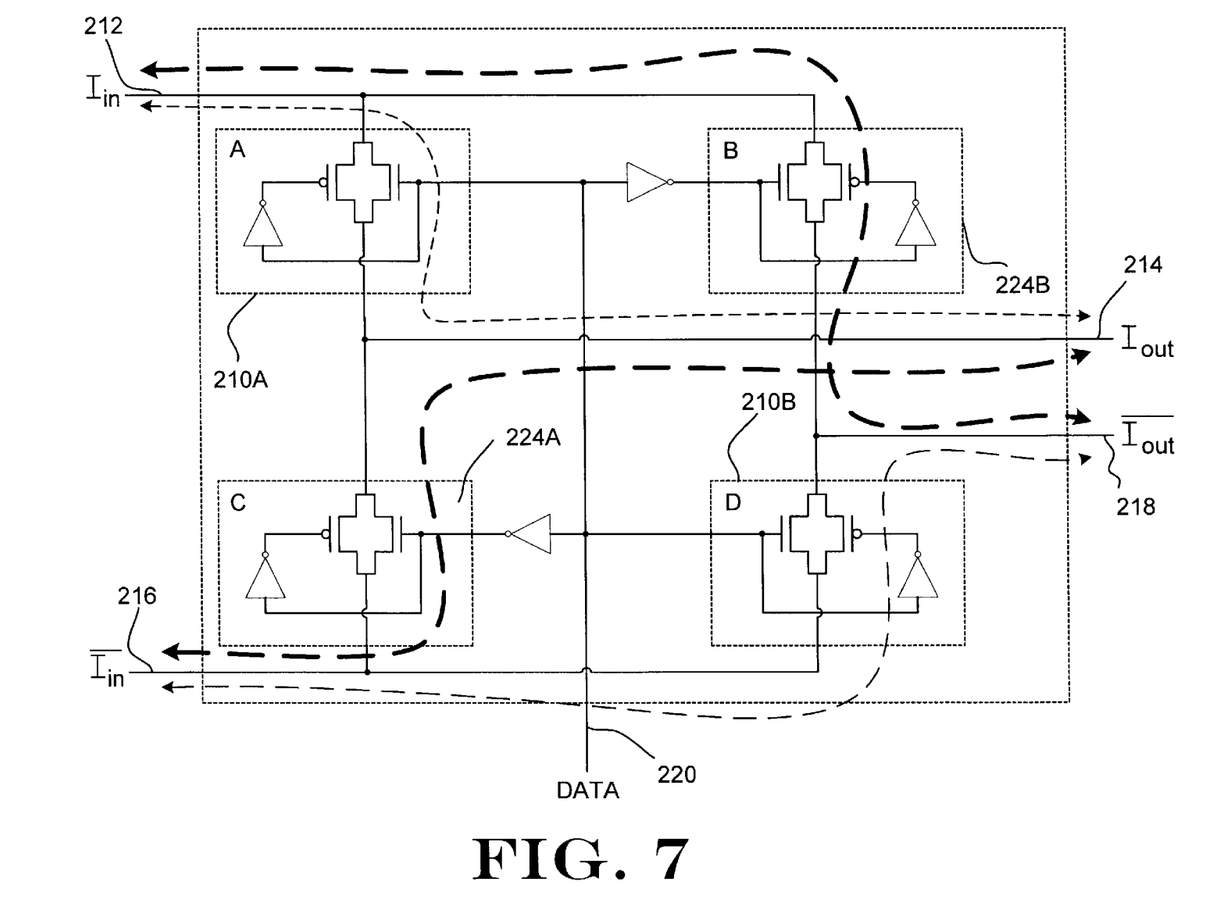
FIG. 7 is a schematic diagram of an illustrative current switch of FIG. 6.

FIG. 7 is a schematic diagram of an illustrative current switch of FIG. 6. In the illustrative embodiment, each current switch may include a first switch including switching elements 21 0A and 21 0B for electrically connecting a first input terminal 212 to a first output terminal 214, and a second input terminal 216 to a second output terminal 218, when a control terminal 220 of the current switch is in a first data state. Each current switch may also have a second switch including switching elements 224A and 224B for electrically connecting the first input terminal 212 to the second output terminal 218, and the second input terminal 216 to the first output terminal 214, when the control terminal 220 of the current switch is in a second data state. Each of the switching elements 210A, 210B, 224A and 224B preferably includes a p-channel transistor and an n-channel transistor coupled in parallel with an inverter driving the gate of the p-channel transistor, as shown. Alternatively, each switching element may including two n-channel or two p-channel transistors coupled in a parallel configuration without the inverter.

Referring back to FIG. 6, the control terminal 230 of the first current switch 186 is preferably controlled by the corresponding write data signal. The control terminal of each subsequent current switch is preferably generated and controlled by exclusive-noring the corresponding write data signal with the write data signal of the previous magneto-resistive pair. For example, the control terminal 232 of the second current switch 234 is generated by exclusive-nor gate 236, which is connected to the first write data signal D0 192 and the second write data signal D1 240. The exclusive-nor function provides the information that is needed to make the appropriate switching decision between the corresponding first and second local write lines. While an exclusive-nor function is shown, other gating functions are contemplated.

Figure 8:
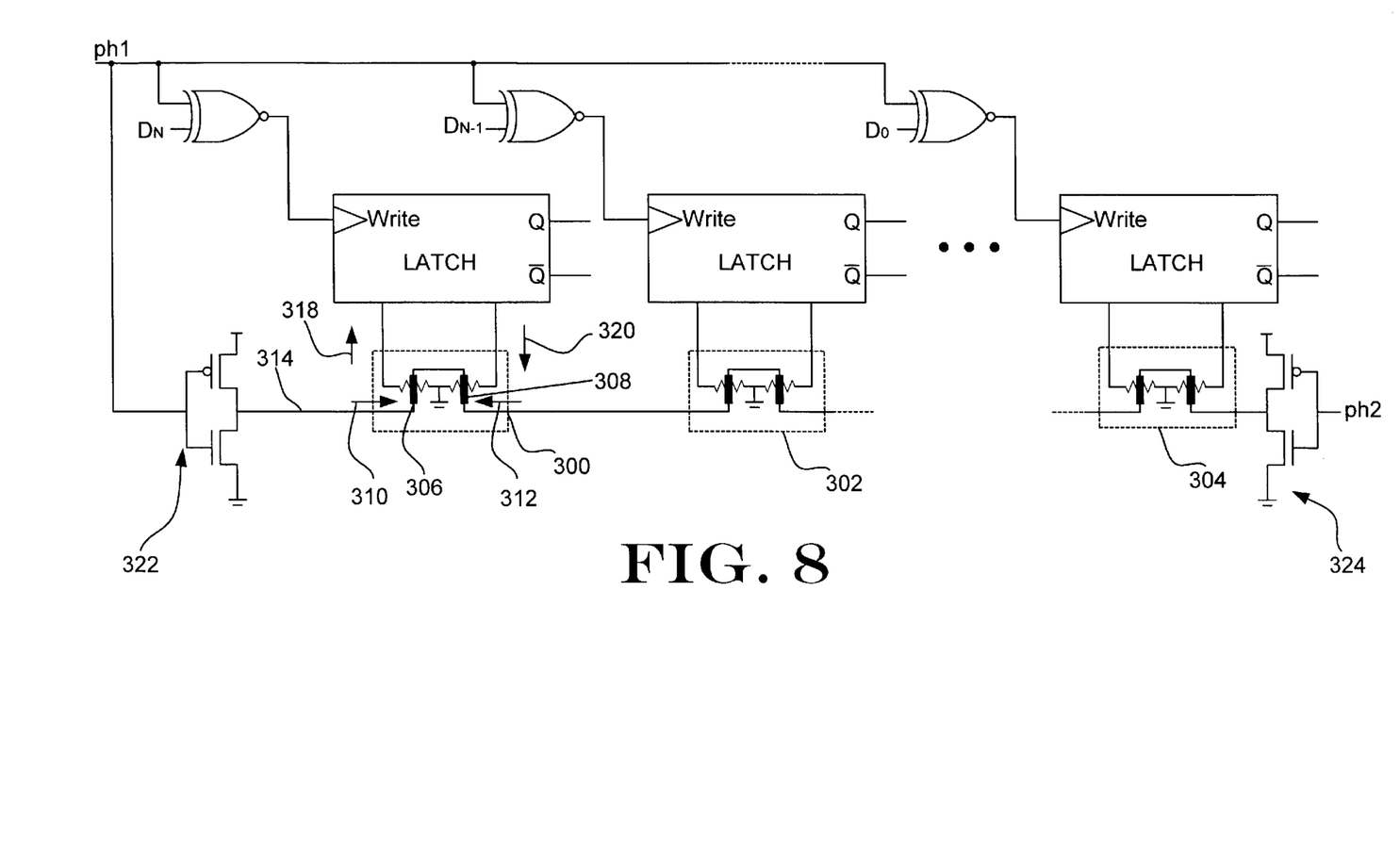
FIG. 8 is a schematic diagram of another illustrative N-bit register in accordance with the present invention.

FIG. 8 is a schematic diagram of another illustrative N-bit register in accordance with the present invention. In this illustrative embodiment, a number of magneto-resistive pairs 300, 302 and 304 are provided, wherein each of the magneto-resistive pairs 300, 302 and 304 selectively receive a sense current in a predetermined direction. For example, magneto-resistive pair 300 includes magneto-resistive element 306 and 308, wherein magneto-resistive element 306 selectively receives a sense current in a first direction 310 and magneto-resistive element 308 selectively receives a sense current in a second direction 312. The magneto-resistive elements are configured such that both a sense current and a write current must pass adjacent to the magneto-resistive element for the magneto-resistive element (e.g., 306 and 308) to be written to a desired state.

In this illustrative embodiment, a single write line 314 may be used. The single write line 314 in a first direction relative to the direction of the sense current in the first magneto-resistive element and in a second direction relative to the direction of the sense current in the second magneto-resistive element. For example, for magneto-resistive pair 300, the single write line 314 extends in a first direction 318 relative to the direction 310 of the sense current in the first magneto-resistive element 306, and in a second direction 320 relative to the direction 312 of the sense current in the second magneto-resistive element 308, or visa versa. This configuration causes each magneto-resistive element of each magneto-resistive pair to be written into opposite resistive states.

To write the magneto-resistive pairs in an illustrative embodiment, a sense current is provided to only those magneto-resistive pairs that have a corresponding write data signal that is in a first data state. Overlapping therewith, a write current is provided in a first direction through the single write line 314 via a write current driver 322. This writes the magneto-resistive elements of those magneto-resistive pairs that have a write data signal that is in a first data state to resistive values that correspond to the first data state.

Thereafter, a sense current is provided to only those magneto-resistive pairs that have a corresponding write data signal that is in a second data state. Concurrently therewith, a write current is provided in a second direction through the single write line 314 via a second current driver 324. This writes the magneto-resistive elements of those magneto-resistive pairs that have a write data signal that is in the second data state to resistive values that correspond to the second data state.

In a preferred embodiment, the sense current is provided by a corresponding latch element. Each latch element is preferably adapted to selectively provide a sense current to the corresponding magneto-resistive pair when a corresponding latch write signal is asserted (see FIG. 1A). In the embodiment shown, the latch write signal is generated by gating the corresponding write data signal with a first clock signal (ph1) preferably using an exclusive-nor gate, as shown. In this configuration, the latch write signals for those latch elements that have a corresponding write data signal in the first data state are asserted when the first clock signal (ph1) is asserted. Likewise, the latch write signals for those latch elements that have a corresponding write data signal in the second data state are asserted when the first clock signal (ph1) is not asserted. Preferably, the second current driver 324 is ended when the first clock signal (ph1) is not asserted.

Having thus described the preferred embodiments of the present invention, those of skill in the art will readily appreciate that the teachings found herein may be applied to yet other embodiments within the scope of the claims hereto attached.

What is claimed is:

1. Apparatus for writing desired states to each of a number of magneto-resistive element pairs, wherein the magneto-resistive elements of each magneto-resistive pair are written into opposite states, and wherein the desired state of each of the magneto-resistive pairs is determined by a corresponding write data signal, comprising:

a first local write line for each magneto-resistive pair, the first local write line extending above a first one of the magneto-resistive elements and below the other of a corresponding magneto-resistive pair;

a second local write line for each magneto-resistive pair, the second local write line extending below the first one of the magneto-resistive elements and above the other of the corresponding magneto-resistive pair; and a current switch for each magneto-resistive pair, where each current switch accepts an input write current from the first and second local write lines of another magneto-resistive pair, and switches the input write current to either the first or second local write lines of the corresponding magneto-resistive pair depending on the state of the corresponding write data signal.

2. An apparatus according to claim 1, wherein the magneto-resistive pairs are arranged in a string configuration with a first magneto-resistive pair at one end of the string and a last magneto-resistive pair at the other end of the string.

3. An apparatus according to claim 2, wherein the current switch associated with the first magneto-resistive pair accepts current from a current source.

4. An apparatus according to claim 3, wherein the first and second write lines of the last magneto-resistive pair are coupled to a voltage.

5. An apparatus according to claim 4, wherein the voltage is ground.

6. An apparatus according to claim 5, wherein there are one or more intermediate magneto-resistive pairs between the first magneto-resistive pair and the last magneto-resistive pair, the first and second write lines of each of the intermediate magneto-resistive pairs being driven by a corresponding current switch and terminating at the current switch of an adjacent magneto-resistive pair.

7. An apparatus according to claim 1, wherein each of the magneto-resistive pairs is coupled a corresponding storage element.

8. An apparatus according to claim 7, wherein each storage element includes a pair of cross-coupled inverters.

9. An apparatus according to claim 8, wherein each of the cross-coupled inverters have an n-channel transistor with a source terminal, and each of the magneto-resistive elements of the corresponding magneto-resistive pair is coupled between the source terminal of a corresponding n-channel transistor and ground.

10. An apparatus according to claim 1, wherein each current switch has an input terminal, a first output terminal, a second output terminal and a control terminal, each switch further comprising:
an n-channel transistor having a source, a drain and a gate;
a p-channel transistor having a source, a drain, and a gate;
the source of the n-channel transistor coupled to the source of the p-channel transistor, and further coupled to the input terminal;
the drain of the n-channel transistor coupled to the first output terminal;
the drain of the p-channel transistor coupled to the second output terminal; and
the gate of the n-channel transistor and the gate of the p-channel transistor coupled to the control input terminal.

11. An apparatus according to claim 10, wherein the input terminal of a selected current switch is coupled to both the first and second local write lines of another magneto-resistive pair, and said first output terminal is coupled to the first local write line and the second output terminal is coupled to the second local write line of the corresponding magneto-resistive pair, the control terminal of the selected current switch is connected to the corresponding write data signal, the current switch switching the write current received from the first and second local write lines of the other magneto-resistive pair to either the first or second local write line of the corresponding magneto-resistive pair via the first and second output terminals, respectively, depending on the state of the corresponding write data signal.

12. An apparatus according to claim 1, wherein each current switch has an input terminal, a first output terminal, a second output terminal and a control terminal, each current switch further comprising:
a first p-channel transistor having a source, a drain and a gate;
a second p-channel transistor having a source, a drain, and a gate;
the source of the first p-channel transistor coupled to the source of the second p-channel transistor, and further coupled to the input terminal;
the drain of the first p-channel transistor coupled to the first output terminal;
the drain of the second p-channel transistor coupled to the second output terminal;
the gate of the first p-channel transistor coupled to the control input terminal; and
an inverter having an input and an output, wherein the input of the inverter is coupled to the control input terminal and the output of the inverter is coupled to the gate of the second p-channel transistor.

13. A method for writing a desired state to a number of magneto-resistive element pairs, wherein the magneto-resistive elements of each magneto-resistive pair are written into opposite states, and wherein the desired state for each of the magneto-resistive pairs is determined by a number of corresponding write data signals, the method comprising the steps of:
providing a first local write line above a first one of each pair of magneto-resistive element pairs and below the other;
providing a second local write line below the first one of each pair of magneto-resistive element pairs and above the other; and
providing a current switch for selected magneto-resistive pairs, said current switch accepting a write current from the first and second local write lines of another magneto-resistive pair, and switching the write current to either the first local write line or the second local write line of the corresponding magneto-resistive pair, depending on the state of the corresponding write data signal.

14. Apparatus for writing a state of a storage element using a write data signal, the storage element having a first magneto-resistive element that have two stable magneto-resistive states, the magneto-resistive states of the first magneto-resistive element determining, at least in part, the state of the storage element when the storage element is written, the apparatus comprising:
current providing means for providing a write current;
a first local write line extending adjacent an upper side of the first magneto-resistive element;
a second local write line extending adjacent a lower side of the first magneto-resistive element; and
current switching means for switching the write current to either said first local write line or said second local write line, depending on the state of the write data signal, whereby said first magneto-resistive element assumes a first magneto-resistive state when the write current passes through said first local write line and a second magneto-resistive state when the write current passes through said second local write line.

15. An apparatus according to claim 14, wherein said storage element further includes a second magneto-resistive element, wherein said second magneto-resistive element is written to the opposite magneto-resistive state as the first magneto-resistive element to also determine, at least in part, the state of the storage element.

16. An apparatus according to claim 15, wherein said first local write line extends adjacent a lower side of the second magneto-resistive element, and said second local write line extends adjacent an upper side of the second magneto-resistive element.

17. An apparatus according to claim 16, further comprising:
a second storage element that has two magneto-resistive elements;
a second current switching means;
said first local write line and said second local write line coupled between said first current switching means and said second current switching means;
a third local write line extending from said second current switching means adjacent an upper side of a first one of the magneto-resistive elements of the second storage element and adjacent a lower side of the second one of the magneto-resistive elements;
a fourth local write line extending from said second current switching means adjacent the lower side of the first one of the magneto-resistive elements of said second storage element and adjacent the upper side of the second one of the magneto-resistive elements of the second storage element; and
said second current switching means switching the write current provided by the first switching means via either the first or second local write lines to the third local write line or the fourth local write line, depending on the state of a second write data signal.

18. An apparatus according to claim 17, wherein said third local write line and fourth local write line are coupled between the second current switching means and yet another current switching means that is associated with yet another storage element.

19. Apparatus for writing desired states to each of a number of magneto-resistive element pairs, wherein each of the magneto-resistive elements of the magneto-resistive pairs selectively carries a sense current in a predetermined direction, each magneto-resistive element of a magneto-resistive pair being written to opposite states, with the desired state of the magneto-resistive pair depending on the corresponding write data signal, each of the magneto-resistive elements being written by passing both the sense current through the magneto-resistive element and a write current adjacent the magneto-resistive element, the apparatus comprising:
a write line extending adjacent to each of the magneto-resistive elements, the write line extending in a first direction relative to the predetermined direction of the sense current of a first magneto-resistive element, and extending in a second direction relative to the predetermined direction of the sense current of a second magneto-resistive element of each of the magneto-resistive pairs;
sense current providing means for selectively providing a sense current to the magneto-resistive elements of selected magneto-resistive pairs;
write current providing means for selectively providing a write current through the write line in either a first direction or a second opposite direction; and
control means for controlling the sense current providing means and said write current providing means, said control means first causing said sense current providing means to provide a sense current to the magneto-resistive elements of those magneto-resistive pairs that have a write data signal that is in a first data state and for concurrently causing said current providing means to provide a write current in a first direction through said write line, said control means then causing said sense current providing means to provide a sense current to the magneto-resistive elements of those magneto-resistive pairs that have a write data signal that is in a second opposite data state, and for concurrently causing said current providing means to provide a write current in a second direction through said write line.

20. An apparatus according to claim 19, wherein said sense current providing means comprises a number of latch elements, wherein each latch element corresponds to one of the magneto-resistive pairs and is adapted to selectively provide a sense current to the magneto-resistive elements of the corresponding magneto-resistive pair, each of the number of latch elements providing the sense current when a corresponding latch write signal is asserted.

21. An apparatus according to claim 20, wherein each of the write data signals is gated with a first clock signal to generate the corresponding latch write signal.

22. An apparatus according to claim 21, wherein each of the write data signals is gated with the first clock signal via an exclusive-or gate to generate the corresponding latch write signal.

23. An apparatus according to claim 21, wherein each of the write data signals is gated with the first clock signal via an exclusive-nor gate to generate the corresponding latch write signal.

24. An apparatus according to claim 21, wherein said write current providing means provides a write current through the write line in the first direction when the first clock signal is asserted.

25. An apparatus according to claim 24, wherein said write current providing means provides a write current through the write line in the second opposite direction when the first clock signal is not asserted.

26. A method for writing desired states to each of a number of magneto-resistive element pairs, wherein each of the magneto-resistive elements of the magneto-resistive pairs selectively carry a sense current in a predetermined direction, each magneto-resistive element of a magneto-resistive pair being written to opposite states, with the desired state of the magneto-resistive pair depending on a corresponding write data signal, each of the magneto-resistive elements being written by passing both a sense current through the magneto-resistive element and a write current adjacent to the magneto-resistive element via a write line, the write line extending in a first direction relative to the predetermined direction of the sense current of a first magneto-resistive element of each of the magneto-resistive pairs, and extending in a second direction relative to the predetermined direction of the sense current of a second magneto-resistive element of each of the magneto-resistive pairs, the method comprising the steps of:
providing a sense current through the magneto-resistive elements of those magneto-resistive pairs that have a corresponding write data signal that is in a first data state;
concurrently providing a write current in a first direction through said write line;
providing a sense current through the magneto-resistive elements of those magneto-resistive pairs that have a write data signal that is in a second opposite data state; and concurrently providing a write current in a second opposite direction through said write line.

27. Apparatus for writing desired states to each of a number of magneto-resistive element pairs, wherein the magneto-resistive elements of each magneto-resistive pair are written into opposite states, with the desired state of the magneto-resistive pair depending on a corresponding write data signal, comprising:
   a first local write line for each magneto-resistive pair, the first local write line extending adjacent a first one of the magneto-resistive elements of a corresponding magneto-resistive pair;
   a second local write line for each magneto-resistive pair, the second local write line extending adjacent the second one of the magneto-resistive elements of the corresponding magneto-resistive pair; and
   a first current switch coupled to the first local write line and the second local write line of a first magneto-resistive pair, and further coupled to a first local write line and a second local write line of second magneto-resistive pair, the first current switch having a first control terminal for controlling the first current switch, the first current switch forming a connection between the first local write line of the second magneto-resistive pair and the first local write line of the first magneto-resistive pair and between the second local write line of the second magneto-resistive pair and the second local write line of the first magneto-resistive pair if the first control terminal is in a first data state, the first current switch forming a connection between the second local write line of the second magneto-resistive pair and the first local write line of the first magneto-resistive pair and between the first local write line of the second magneto-resistive pair and the second local write line of the first magneto-resistive pair if the first control terminal is in a second opposite data state.

28. An apparatus according to claim 27, further comprising a second current switch current switch coupled to the first local write line and the second local write line of the second magneto-resistive pair, and further coupled to a first local write line and a second local write line of a third magneto-resistive pair, the second current switch having a second control terminal for controlling the second current switch, the second current switch forming a connection between the first local write line of the third magneto-resistive pair and the first local write line of the second magneto-resistive pair and between the second local write line of the third magneto-resistive pair and the second local write line of the second magneto-resistive pair if the corresponding second control terminal is in a first data state, the second current switch forming a connection between the second local write line of the third magneto-resistive pair and the first local write line of the second magneto-resistive pair and between the first local write line of the third magneto-resistive pair and the second local write line of the second magneto-resistive pair if the second control terminal is in a second opposite data state.

29. An apparatus according to claim 27, wherein the first local write line and the second local write line of the third magneto-resistive pair are electrically connected after extending adjacent the first one of the magneto-resistive elements and the second one of the magneto-resistive elements, respectively, of the third magneto-resistive pair.

30. An apparatus according to claim 27, wherein the first local write line of the first magneto-resistive pair is electrically connected to a current source.

31. An apparatus according to claim 30, wherein the second local write line of the first magneto-resistive pair is electrically connected to ground.

32. An apparatus according to claim 27, wherein the first control terminal of the first current switch is controlled by a first write data signal.

33. An apparatus according to claim 32, wherein the second control terminal of the second current switch is controlled by a gated signal generated by gating the first write data signal and a second write data signal.

34. An apparatus according to claim 33, wherein the gated signal is generated by gating the first write data signal and the second write data signal using an exclusive-nor gate.

35. An apparatus according to claim 27, wherein each of the magneto-resistive pairs is coupled a corresponding storage element.

36. An apparatus according to claim 35, wherein each storage element includes a pair of cross-coupled inverters.

37. An apparatus according to claim 36, wherein each of the cross-coupled inverters have an n-channel transistor with a source terminal, and each of the magneto-resistive elements of the corresponding magneto-resistive pair is coupled between the source terminal of a corresponding n-channel transistor and ground.

38. A method for writing desired states to each of a number of magneto-resistive element pairs, wherein the magneto-resistive elements of each magneto-resistive pair are written into opposite states, with the desired state of the magneto-resistive pair depending on a corresponding write data signal, each magneto-resistive pair having a first local write line and a second local write line, wherein the first local write line passes adjacent a first one of the magneto-resistive elements of a corresponding magneto-resistive pair, and the second local write line extends passed the second one of the magneto-resistive elements of the corresponding magneto-resistive pair, each of the magneto-resistive elements being written to a first state when a write current flows in a first direction relative to the magneto-resistive element and to a second opposite state when a write current flows in a second direction relative to the magneto-resistive element, the method comprising the steps of;
   providing a write current; and
   selectively connecting the first and second local write lines of each of the magneto-resistive pairs such that the write current passes in a first direction through the first local write line of all of those magneto-resistive pairs that have a write data signal that is in a first data state and through the second local write line of all of those magneto-resistive pairs that have a write data signal that is in a second data state, and such that the write current passes in a second direction through the first local write line of all of those magneto-resistive pairs that have a write data signal that is in the second data state and through the second local write line of all of those magneto-resistive pairs that have a write data signal that is in the first data state.

39. A current switch having a first input terminal, a second input terminal, a first output terminal, a second output terminal and a control terminal, the current switch comprising:
   first connecting means for electrically connecting the first input terminal to the first output terminal and the second input terminal to the second output terminal, when the control terminal of the current switch is in a first data state; and
   second connecting means for electrically connecting the first input terminal to the second output terminal and the second input terminal to the first output terminal, when the control terminal of the current switch is in a second data state.

40. A current switch according to claim 39, wherein said first connecting means includes a first switching element and a second switching element, wherein the first switching element connects the first input terminal to the first output terminal and the second switching element connects the second input terminal to the second output terminal when the control terminal of the current switch is in the first data state.

41. A current switch according to claim 40, wherein said second connecting means includes a third switching element and a fourth switching element, wherein the third switching element connects the first input terminal to the second output terminal and the fourth switching element connects the second input terminal to the first output terminal when the control terminal of the current switch is in the second data state.

42. A current switch according to claim 40, wherein each switching element has an input terminal, an output terminal and a local control terminal, each switching element further comprising:

a p-channel transistor having a source, a drain and a gate;

an n-channel transistor having a source, a drain, and a gate;

the source of the p-channel transistor coupled to the source of the n-channel transistor, and further coupled to the input terminal;

the drain of the p-channel transistor coupled to the drain of the n-channel transistor, and further coupled to the output terminal;

the gate of the n-channel transistor coupled to the local control terminal; and an inverter having an input and an output, wherein the input of the inverter is coupled to the local control terminal and the output of the inverter is coupled to the gate of the p-channel transistor.

* * * * *

UNITED STATES PATENT AND TRADEMARK OFFICE
CERTIFICATE OF CORRECTION

PATENT NO.   : 6,178,111 B1
DATED        : January 23, 2001
INVENTOR(S)  : Jeffrey Sather, Theodore Zhu and Yong Lu It is certified that error appears in the above-identified patent and that said Letters Patent is hereby corrected as shown below:

<u>Column 1,</u>
Line 11, please add the following paragraph:
-- This invention was made with Government support under Contract Number N00014-96-C-2114 awarded by NRL (Naval Research Laboratory) and Contract Number N00030-99-C-0019 awarded by Charles Stark Draper Laboratory. The Government has certain rights in this invention. --

Signed and Sealed this

Eighth Day of July, 2003

JAMES E. ROGAN
*Director of the United States Patent and Trademark Office*